United States Patent [19]

Nakatsu

[11] Patent Number: 4,927,371
[45] Date of Patent: May 22, 1990

[54] SOCKET FOR SEMICONDUCTOR DEVICE

[75] Inventor: Hiroshi Nakatsu, Tenri, Japan

[73] Assignee: Sharp Kabushiki Kaisha, Osaka, Japan

[21] Appl. No.: 242,980

[22] Filed: Sep. 12, 1988

[30] Foreign Application Priority Data

Sep. 14, 1987 [JP] Japan .................................. 62-140657

[51] Int. Cl.$^5$ ............................................. H01R 9/09
[52] U.S. Cl. ................................... 439/79; 350/96.20; 350/96.21; 439/83; 439/606
[58] Field of Search ........................ 439/79–83, 439/606, 722; 350/96.2, 96.21

[56] References Cited

U.S. PATENT DOCUMENTS

| | | | |
|---|---|---|---|
| 2,958,065 | 10/1960 | Flanagan, Jr. | 439/80 |
| 3,335,387 | 8/1967 | Mueller | 339/17 |
| 4,294,512 | 10/1981 | Logan | 439/59 |
| 4,461,537 | 7/1984 | Raymer, II et al. | 350/96.21 |
| 4,612,602 | 9/1986 | Weyer et al. | 361/394 |
| 4,767,179 | 8/1988 | Sampson et al. | 350/96.2 |
| 4,767,342 | 8/1988 | Sato | 439/83 |
| 4,778,240 | 10/1988 | Komatsu | 350/96.2 |
| 4,779,948 | 10/1988 | Wais et al. | 350/96.2 |

FOREIGN PATENT DOCUMENTS 3432048.2 3/1986 Fed. Rep. of Germany .
8630056.3 2/1987 Fed. Rep. of Germany .

Primary Examiner—P. Austin Bradley
Attorney, Agent, or Firm—Birch, Stewart, Kolasch & Birch

[57] ABSTRACT

A socket for a semiconductor device comprises receiving holes to which lead pins of the semiconductor device are inserted, and conductive coupling portions for connecting the receiving holes and conductive portions of a circuit board. The socket is placed on a circuit board and the conductive coupling portions are connected to the conductive portions of the circuit board to be mounted. The lead pin receiving holes of the socket are formed to be parallel to the surface of the circuit board when the socket is mounted on the circuit board.

15 Claims, 4 Drawing Sheets

SOCKET FOR SEMICONDUCTOR DEVICE

BACKGROUND OF THE INVENTION

1. Field of the Invention

The present invention relates to a socket for mounting a semiconductor laser and the like employed in devices for optical transmission, devices for optical LAN (Local Area Network) and the like, on a substrate.

2. Description of the Prior Art

A semiconductor laser is used as a light source in a compact disk player, a laser printer, or the like. As shown in FIG. 8, a package 1 of a round type semiconductor laser normally has its current introducing pin, an output lead pin 3 and so on projected in the direction horizontal to the direction of emission of the laser chip 2. This structure is for convenience of connection to an optical system mainly comprising a lens, a prism and the like. FIG. 9 shows the package 1 of the semiconductor laser actually applied on a circuit board as a fiber output for optical transmission. The semiconductor laser package 1 is fixed in a direction vertical to the surface of the circuit board 4 with tip end portions of the lead pins 3 passing through the circuit board 4 to be soldered 5 on the rear surface of the board 4. A fiber cable 7 is connected to an emitting side of the semiconductor package 1 through a connector 6 coaxially with the laser emitting axis. Therefore, mounted in this manner, the fiber cable 7 is drawn out in the direction vertical to the surface of the circuit board 4.

However, the above described mounting method is inconvenient when devices for optical transmission and the like should be made compact. More specifically, when a number of circuit boards 4 should be stacked on each other to make the device compact, the fiber cable 7 becomes an obstruction in stacking boards since it is drawn out in the direction of stacking. In order to solve this problem, the fiber cable 7 should be drawn out in the direction parallel to the surface of the board 4. FIG. 10 shows a mounting method in which lead pins 3 of the semiconductor laser package 1 are bent so that the fiber cable 7 is drawn out in the direction parallel to the surface of the substrate 4. However, this method has disadvantages that the bent portions of the lead pins 3 become physically weak, and that there is no reproductivity, that is, when a semiconductor laser should be replaced, it cannot be attached on the same portion as that before the replacement.

The above described problems are derived from the fact that the package 1 of the semiconductor laser is directly mounted on the circuit board.

SUMMARY OF THE INVENTION

An object of the present invention is to provide a socket for a semiconductor device which enables spatially effective stacking of circuit boards with semiconductor devices mounted thereon.

A socket for a semiconductor device in accordance with the present invention is used for fixing a semiconductor device having a plurality of lead pins on a circuit board, comprising a plurality of receiving holes extending in parallel with the circuit board with their inner surfaces formed of conductive materials for receiving each of the plurality of lead pins. The socket further comprises a plurality of conductive coupling portions for coupling the receiving holes and conductive portions provided on the circuit board. A semiconductor device, for example a semiconductor laser is mounted with the emitting direction of the laser beam being parallel to the surface of the circuit board by means of the socket for semiconductor devices in accordance with the present invention connected to the circuit board. As a result, the direction of drawing out the fiber cable and the like to be connected to the semiconductor laser can be made parallel to the surface of the board. This enables stacking of a plurality of circuit boards with semiconductor lasers mounted thereon, thereby making compact the device.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
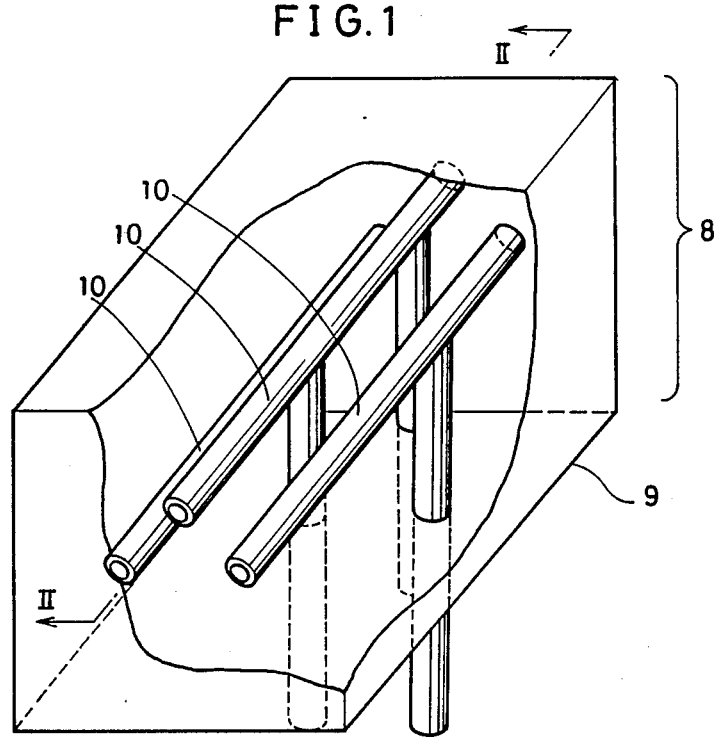
FIG. 1 is a schematic perspective view of a socket for a semiconductor laser showing a first embodiment of the present invention.
Figure 2:
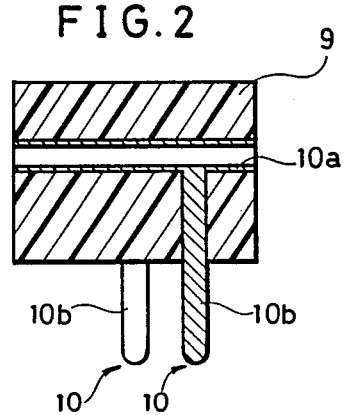
FIG. 2 is a cross sectional view of the socket for a semiconductor laser taken along the line II—II of FIG. 1.

Embodiments of the present invention will be described in the following with reference to the figures. FIG. 1 shows a first embodiment of a socket for a semiconductor laser in accordance with the present invention. The socket 8 for a semiconductor laser has three T shaped contacts 10 formed of a conductive metal in a rectangular solid of mold resin 9. A pin for introducing current, a pin for outputting monitor current and a pin for case grounding of a semiconductor laser package are respectively inserted to the three contacts 10. FIG. 2 is a cross sectional view of the socket 8 for a semiconductor laser shown in FIG. 1 taken along the line II—II. The contact 10 is constituted by a hollow column female contact 10a and a solid column male contact 10b connected with each other to form a T shape. The female contact 10a is provided such that both end surfaces of the female contact 10a appear on a section in the longitudinal direction of the mold resin 9. The male contact 10b is provided such that one end portion of the male contact 10b protrudes from the bottom portion of the mold resin 9.

Figure 3:
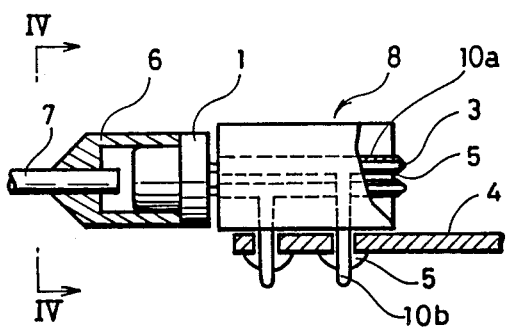
FIG. 3 shows the laser socket of the present invention actually applied on a circuit board.

FIG. 3 shows the socket 8 for a semiconductor laser in accordance with the present invention with a semiconductor laser package 1 loaded therein, which is further mounted on a board 4. The female contact 10a of the T shaped contact 10 may be longer or shorter than the lead pin 3 of the semiconductor laser package 1. If the lead pin 3 is longer than the female contact 10a as shown in FIG. 3, the lead pin 3 may be soldered on an end portion of the female contact 10a to be fixed.

Figure 4:
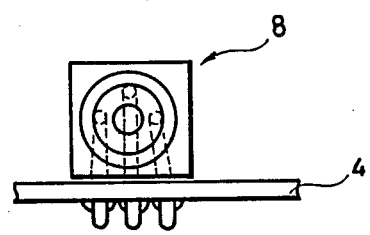
FIG. 4 is a side view of FIG. 3.

The male contacts 10b of the contact 10 protruding from the bottom surface of the socket 8 for a semiconductor laser pass through the board 4 and soldered on a wiring pattern arranged on the board 4 to be incorporated in the circuit. As is shown in the figure, the fiber cable 7 connected to the semiconductor laser package 1 is drawn out in the direction parallel to the surface of the circuit board 4. FIG. 4 shows the device of FIG. 3 viewed from the line IV—IV.

Figure 5:
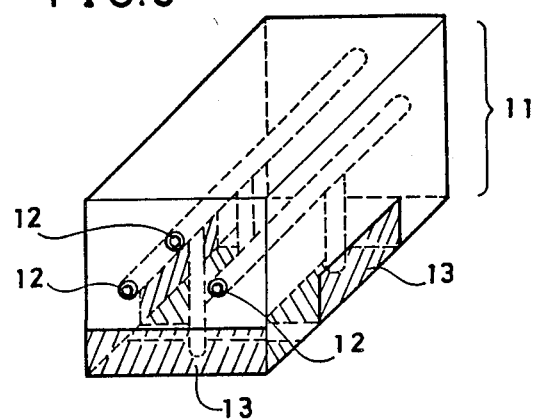
FIG. 5 is a schematic perspective view of a socket for a semiconductor laser showing a second embodiment of the present invention.
Figure 6:
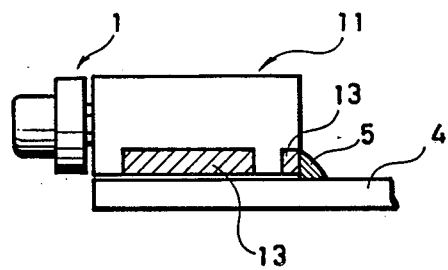
FIG. 6 shows the socket for a semiconductor laser of the second embodiment actually applied on a circuit board.
Figure 7:
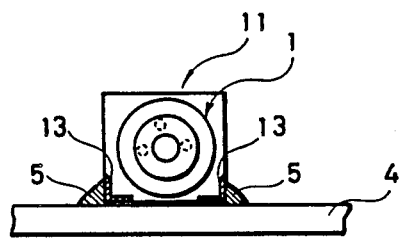
FIG. 7 is a side view of FIG. 6.
Figure 8:
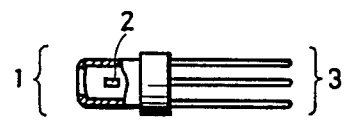
FIG. 8 shows an external form of a semiconductor laser package.
Figure 9:
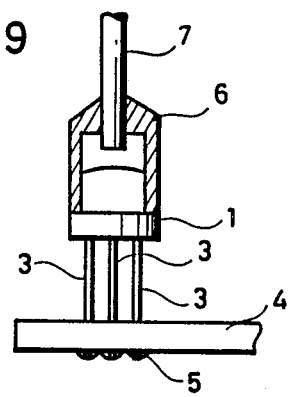
FIG. 9 shows a conventional method for mounting a semiconductor laser.
Figure 10:
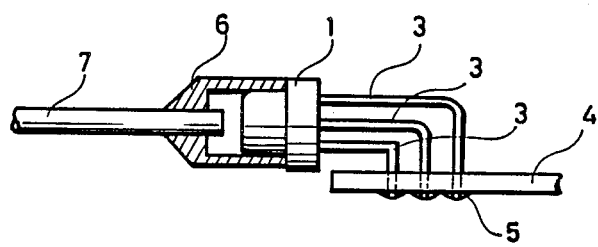
FIG. 10 shows another conventional method for mounting a semiconductor laser.

FIG. 5 shows a second embodiment of the present invention. The socket 11 for a semiconductor laser in accordance with this embodiment comprises a contact 12 to which lead pins 3 of the semiconductor laser package 1 are inserted and an electrode 13 connected to the contact 12 and electrically conductive with the lead pins 3. The electrode 13 is formed such that the surface of the electrode is exposed in three directions near the bottom portion of the socket 11 for the semiconductor laser. As shown in FIGS. 6 and 7, the socket 11 is mounted on the circuit board 4 with the electrode 13 soldered on the wiring pattern of the board to be incorporated in the circuit. The socket 11 for the semiconductor laser in accordance with the present embodiment may be arranged on the board to be directly soldered in the solder tab as other sockets for semiconductor devices, and it may be loaded with the semiconductor laser package thereafter. Therefore, compared with conventional method for mounting, the semiconductor laser can be more easily mounted. Although the number of lead pins of the semiconductor laser package is three in the above described first and second embodiments, the socket for a semiconductor laser in accordance with the present invention can be applied to a semiconductor laser package with arbitrary number of lead pins by changing the number of contacts or the number of electrodes of the laser socket. Although the socket for a semiconductor device in accordance with the present invention is preferably used as a socket for a semiconductor laser, it may be applied to other semiconductor devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A socket for a semiconductor device used for mounting a semiconductor device having a plurality of lead pins on a circuit board, comprising:
    a socket body having a shape in the form of a generally solid rectangular block;
    a plurality of receiving holes in said socket body, said receiving holes extending in mutually parallel relationship and having inner surfaces of conductive material for receiving each of said plurality of lead pins; and
    a plurality of conductive coupling portions extending at right angles to and contacting said inner surfaces of said receiving holes for coupling said receiving holes to conductive portions of said circuit board.

2. A socket for a semiconductor device according to claim 1, wherein said conductive coupling portion has a pin shape formed of a conductive material with one tip end portion of the pin protruding from that bottom surface of said socket body which is placed on said circuit board.

3. A socket for a semiconductor device according to claim 1, wherein each of said conductive coupling portions further comprises an electrode surface exposed on an outer surface of said socket body.

4. A socket according to claim 1 wherein said receiving holes extend entirely through said socket body between end surfaces thereof.

5. A socket according to claim 1 wherein said receiving holes extend within said socket body on at least two different levels thereof.

6. A socket according to claim 1 wherein said conductive coupling portions comprise solid members orthogonally extending from mutually different positions along the length of said receiving holes.

7. A socket for a semiconductor device according to claim 1, wherein said socket body is molded by a resin material around said plurality of receiving holes and said plurality of conductive coupling portions.

8. A socket according to claim 7 wherein said conductive coupling portions extend downwardly from mutually different positions along the longitudinal direction of said receiving holes.

9. A socket for mounting a semiconductor device having a plurality of connector pins on a circuit board, comprising:
    a socket body molded by a resin material around a plurality of receiving holes and a respective plurality of conductive coupling portions coupling said receiving holes and conductive portions of said circuit board, said plurality of receiving holes extending parallel to said circuit board, with inner surfaces of said receiving holes comprised of conductive material for receiving each of said plurality of connector pins and contacting said conductive coupling portions;
    said plurality of conductive coupling portions comprising conductive members extending orthogonally from said receiving holes and terminating in respective electrode surfaces exposed on an outer surface of said socket body.

10. A socket according to claim 9 wherein said receiving holes extend within said socket body on at least two different levels thereof.

11. A socket according to claim 9 wherein said conductive coupling portions extend downwardly from mutually different positions along the longitudinal direction of said receiving holes.

12. A socket according to claim 9 wherein said conductive coupling portions comprise solid members orthogonally extending from mutually different positions along the length of said receiving holes.

13. A socket according to claim 9 wherein said socket body is in the form of a generally rectangular block.

14. A socket according to claim 9 wherein said receiving holes extend entirely through said socket body between end surfaces thereof.

15. A socket according to claim 9 wherein said socket body includes at least one flat surface for providing a stable support surface for mounting on said circuit board.

* * * * *